(12) United States Patent
Liao et al.

(10) Patent No.: US 6,853,133 B2
(45) Date of Patent: Feb. 8, 2005

(54) PROVIDING AN EMISSION-PROTECTING LAYER IN AN OLED DEVICE

(75) Inventors: Liang-Sheng Liao, Rochester, NY (US); Kevin P. Klubek, Webster, NY (US); Dustin L. Comfort, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/431,303

(22) Filed: May 7, 2003

(65) Prior Publication Data

US 2004/0222738 A1 Nov. 11, 2004

(51) Int. Cl.[7] .................................................. H01J 1/62

(52) U.S. Cl. ...................................... 313/504; 313/506

(58) Field of Search ................................. 313/498, 504, 313/506, 511

(56) References Cited

U.S. PATENT DOCUMENTS 4,769,292 A 9/1988 Tang et al.

OTHER PUBLICATIONS

"Organic Electroluminescent Diodes" by C. W. Tang, et al., Applied Physics Letter 51 (12) Sep. 21, 1987, pp. 913–915.
"A Chemical Failure Mechanism for Aluminum(III) 8–Hydroxyquinoline Light–Emitting Devices" by F. Papadimitrakopoulos et al., Chemical Material 1996, 8, pp. 1363–1365.

"Electroluminescence of Doped Organic Thin Films", by C. W. Tang, et al., Journal of Applied Physics 65 (9) May 1, 1989, pp. 3610–3616.

"Electroluminescence In Organic Films with Three–Layer Structure", by Chihaya Adachi et a., Japanese Journal of Applied Physics, vol. 27, No. 2, Feb., 1988, pp. L269–L271.

*Primary Examiner*—Vip Patel
(74) *Attorney, Agent, or Firm*—Raymond L. Owens

(57) ABSTRACT

An organic light-emitting device with improved performance including an anode formed over a substrate; a hole-transporting layer formed over the anode; and a light emitting layer formed over the hole-transporting layer for producing light in response to hole-electron recombination. The organic light-emitting device also includes an emission-protecting layer formed over the light-emitting layer, wherein the emission-protecting layer includes one or more materials selected to resist the surface contamination on the organic light-emitting layer and to ensure that there will be less surface contamination than if such layer had not been provided; an electron-transporting layer formed over the emission-protecting layer; and a cathode formed over the electron-transporting layer.

23 Claims, 3 Drawing Sheets ously assigned U.S. Pat. No. 4,769,292] demonstrated # PROVIDING AN EMISSION-PROTECTING LAYER IN AN OLED DEVICE

FIELD OF INVENTION

The present invention relates to minimizing contamination of light-emitting layers in an organic electroluminescent (EL) device.

BACKGROUND OF THE INVENTION

Organic electroluminescent (EL) devices or organic light-emitting diodes (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. "Organic Electroluminescent Diodes", *Applied Physics Letters,* 51, 913 (1987), and commonly assigned U.S. Pat. No. 4,769,292] demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics,* 27, L269 (1988), and by Tang et al., "Electroluminescence of Doped Organic Thin Films", *Journal of Applied Physics,* 65, 3610 (1989). The LEL commonly consists of a host material doped with a guest material. Wherein the layer structures are denoted as HTL/LEL/ETL. Further, there are other multilayer OLEDs that contain more functional layers in the devices. At the same time, many kinds of EL materials are also synthesized and used in OLEDs. These new structures and new materials have further resulted in improved device performance.

As is known, most EL materials are sensitive to oxygen and/or moisture and/or other components. For example, tris(8-hydoxyquinoline) aluminum (Alq) is known to react with water [F. Papadimitrakopoulos et al, "A Chemical Failure Mechanism for Aluminum(III) 8-Hydorxyquinoline Light-Emitting Devices", *Chem. Mater.* 8, 1363 (1996)]. The use of a vacuum or low oxygen and/or water conditions during device fabrication steps can help reduce the failure rate of OLED devices. However, inadvertent contamination of the device by oxygen, moisture, and/or other components is possible during or between deposition steps or anytime there is an apparatus transfer or delay between steps. This can lead to inferior EL performance due to luminance quenching and/or higher carrier injecting barriers caused by the contaminants.

In a full-color organic display, there is an array of colored pixels such as red, green and blue color (commonly referred to as RGB pixels). Precision patterning of the colored LEL is required to produce the RGB pixels. The RGB pixels are fabricated through several steps, and each colored LEL needs its own special patterning and evaporation steps. Only after all of the three colored LELs are pixelized, the subsequent common ETL and other common layers can be fabricated on the top of the colored pixels. Therefore, there is a certain amount of waiting time during each pixel patterning step and between the steps of the pixel patterning and the subsequent ETL fabrication. During the waiting interval, the surface of the individual colored LEL's is exposed to an environment which will have different colored molecules. Therefore, contamination is inevitable although the environment is under the vacuum conditions. As a result, the contaminated pixels could have inferior EL performance, such as sudden initial luminance drop, or worse operational stability. Moreover, in some cases, the LEL has to be exposed to atmosphere for a certain period of time before continuing the subsequent fabrication steps. In this situation, the surface of the air exposed LEL is severely contaminated by moisture and other unwanted components resulting in inferior EL performance. In addition, during the fabrication of some types of OLEDs by using polymers as the LEL (polymeric OLEDs), the spin-coated or ink-jet printed LEL has to be annealed at a specific temperature over a period of time before continuing the subsequent fabrication steps. Therefore, the annealed surface is also severely contaminated by unwanted components resulting in inferior EL performance.

SUMMARY OF THE INVENTION

It is therefore an object of the present invention to reduce the surface contamination effects on the EL performance of an OLED device.

This object is achieved by an organic light-emitting device with improved performance comprising:

a) an anode formed over a substrate;

b) a hole-transporting layer formed over the anode;

c) a light-emitting layer formed over the hole-transporting layer for producing light in response to hole-electron recombination;

d) an emission-protecting layer formed over the light-emitting layer, wherein the emission-protecting layer includes one or more materials selected to resist the surface contamination on the organic light-emitting layer and to ensure that there will be less surface contamination than if such layer had not been provided;

e) an electron-transporting layer formed over the emission-protecting layer; and f) a cathode formed over the electron-transporting layer.

ADVANTAGES

It is an advantage of the present invention that it can reduce the loss of luminance in an OLED device due to exposure of the OLED layers to air or due to a delay during manufacturing. It is a further advantage that an OLED device manufactured in accordance with the present invention has improved operational stability.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" is used in its art-recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel, which can be independently addressable to emit a specific color. For example, a blue subpixel is that portion of a pixel which can be addressed to produce blue light. In a full-color display, a pixel generally comprises three primary-color subpixels, namely blue, green, and red.

Figure 1:
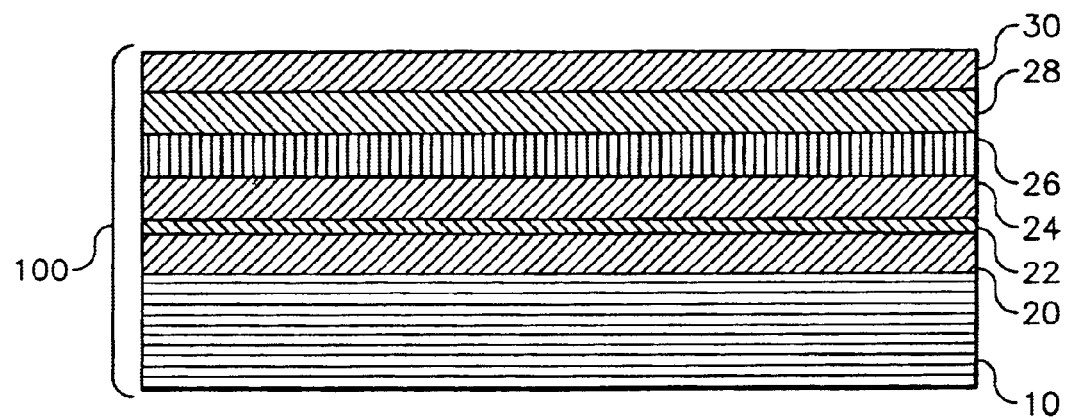
FIG. 1 shows a cross-sectional view of a prior art OLED device.

Turning now to FIG. 1, there is shown a cross-sectional view of a prior art OLED device. OLED device 100 includes substrate 10. Substrate 10 can be an organic solid, an inorganic solid, or a combination of organic and inorganic solids that provides a surface for receiving organic material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Anode 20 is formed over substrate 10. When EL emission is viewed through the substrate 10, the anode should be transparent or substantially transparent to the emission of interest. Common transparent anode materials useful in the present invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, regardless if it is transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 22 be formed over anode 20 in an organic light-emitting display. The hole-injecting material can serve to improve the film formation property of subsequent organic layers and to facilitate injection of holes into the hole-transporting layer. Suitable materials for use in the hole-injecting layer 22 include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

While not always necessary, it is often useful that a hole-transporting layer 24 be formed over hole-injecting layer 22, or over anode 20 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 24 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric aryl amine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A

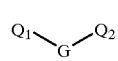

wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

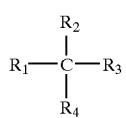

B where:
R$_1$ and R$_2$ each independently represent a hydrogen atom, an aryl group, or an alkyl group or R$_1$ and R$_2$ together represent the atoms completing a cycloalkyl group; and
R$_3$ and R$_4$ each independently represent an aryl group, which is in turn substituted with a diaryl substituted amino group, as indicated by structural Formula C.

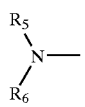

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

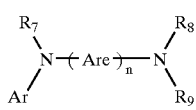

D wherein:
each Are is an independently selected arylene group, such as a phenylene or anthracene moiety;
n is an integer of from 1 to 4; and
Ar, R$_7$, R$_8$, and R$_9$ are independently selected aryl groups.
In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triaryl amine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

A LEL 26 producing light in response to hole-electron recombination is formed over anode 20 and over any other layers formed, such as hole-transporting layer 24. Desired organic light-emitting materials can be deposited by any suitable means such as evaporation, sputtering, chemical vapor deposition, electrochemical means, or radiation transfer from a donor material. Useful organic light-emitting materials are well known. As more fully described in U.S. Pat. Nos. 4,769,292 and 5,935,721, the LEL 26 of the organic EL element comprises a luminescent or fluorescent material where electroluminescence is produced as a result of electron-hole pair recombination in this region. The LEL 26 can be comprised of a single material, but more commonly includes a host material doped with a guest compound or dopant where light emission comes primarily from the dopant and can be of any color. The host materials in the LEL 26 can be an electron-transporting material, as defined below, a hole-transporting material, as defined above, or another material that supports hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

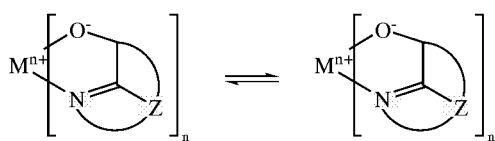

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo {f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(II)]
CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

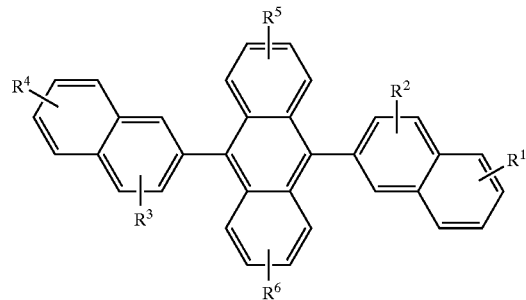

F wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

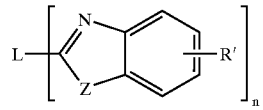

G where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

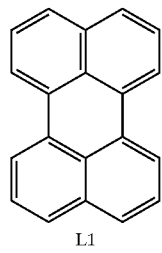
L1
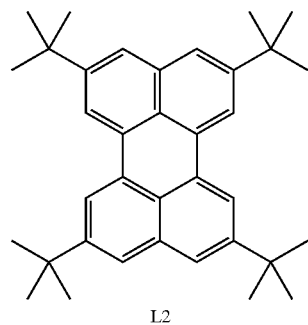
L2
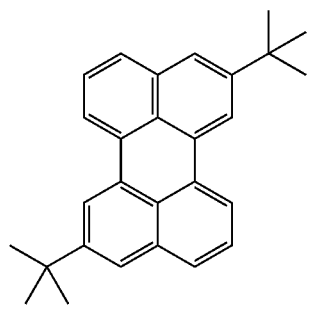
L3
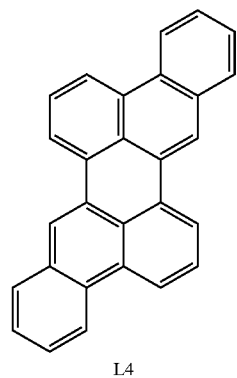
L4
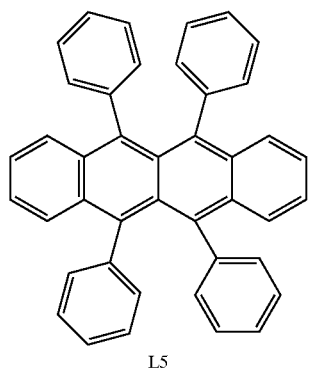
L5
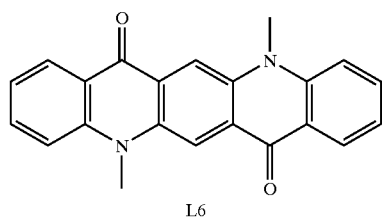
L6
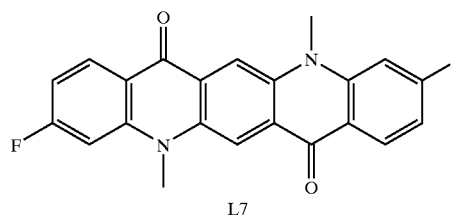
L7
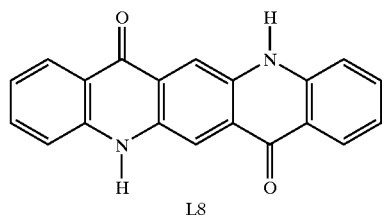
L8

-continued

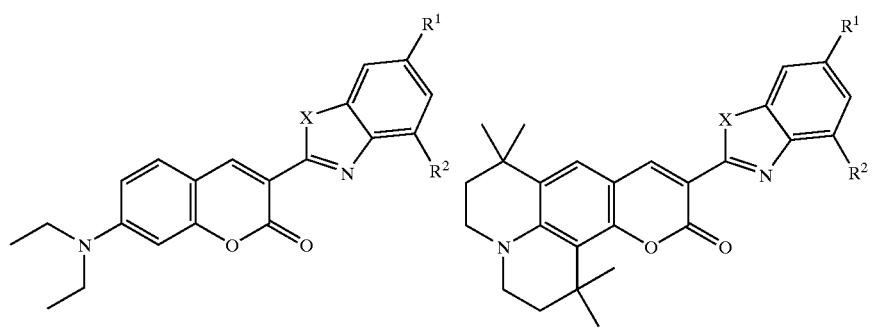

|     | X | R1     | R2     |     | X | R1     | R2     |
|-----|---|--------|--------|-----|---|--------|--------|
| L9  | O | H      | H      | L23 | O | H      | H      |
| L10 | O | H      | Methyl | L24 | O | H      | Methyl |
| L11 | O | Methyl | H      | L25 | O | Methyl | H      |
| L12 | O | Methyl | Methyl | L26 | O | Methyl | Methyl |
| L13 | O | H      | t-butyl| L27 | O | H      | t-butyl|
| L14 | O | t-butyl| H      | L28 | O | t-butyl| H      |
| L15 | O | t-butyl| t-butyl| L29 | O | t-butyl| t-butyl|
| L16 | S | H      | H      | L30 | S | H      | H      |
| L17 | S | H      | Methyl | L31 | S | H      | Methyl |
| L18 | S | Methyl | H      | L32 | S | Methyl | H      |
| L19 | S | Methyl | Methyl | L33 | S | Methyl | Methyl |
| L20 | S | H      | t-butyl| L34 | S | H      | t-butyl|
| L21 | S | t-butyl| H      | L35 | S | t-butyl| H      |
| L22 | S | t-butyl| t-butyl| L36 | S | t-butyl| t-butyl|

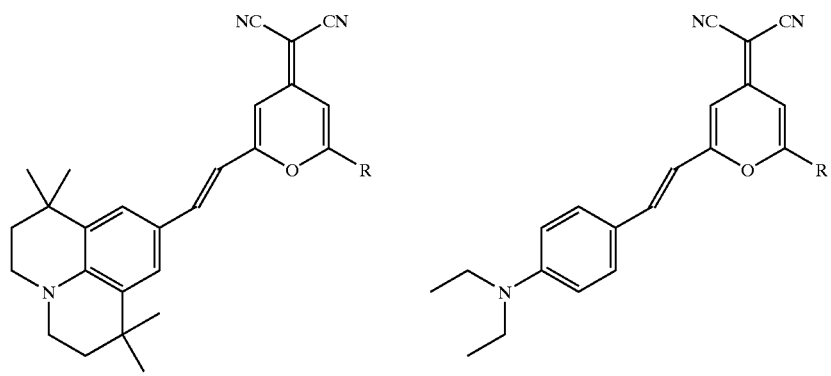

|     | R       |     | R       |
|-----|---------|-----|---------|
| L37 | phenyl  | L41 | phenyl  |
| L38 | methyl  | L42 | methyl  |
| L39 | t-butyl | L43 | t-butyl |
| L40 | mesityl | L44 | mesityl |

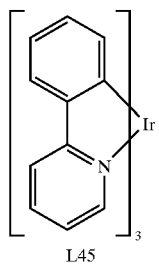

L45

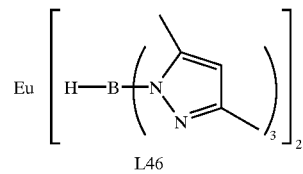

L46

-continued

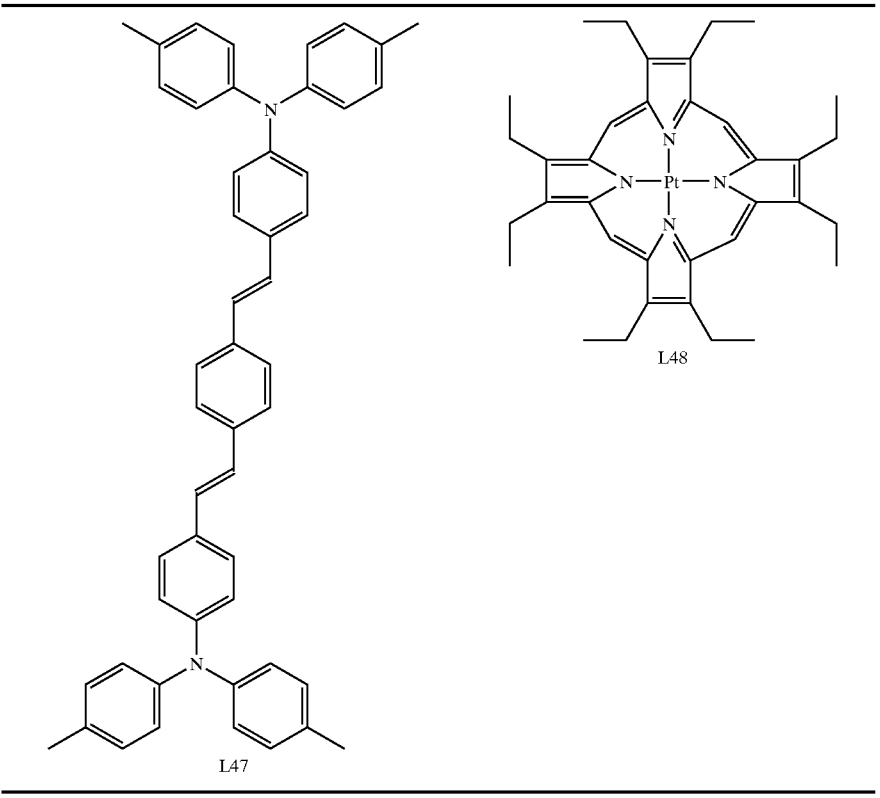

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Although not shown, LEL 26 can additionally comprise two or more emissive layers, if such is desired for proper emissive properties of the resulting OLED device.

Electron-transporting layer 28 is formed over LEL 26. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 28 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Cathode 30 is formed over electron-transporting layer 28. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 2:
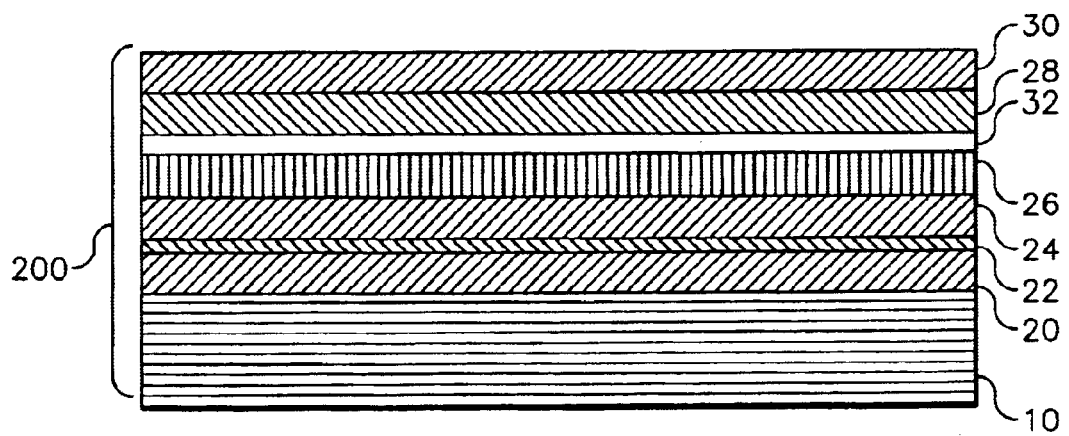
FIG. 2 shows a cross-sectional view of one embodiment of an OLED device prepared with an emission-protecting layer over the light-emitting layer in accordance with the present invention.

Turning now to FIG. 2, there is shown a cross-sectional view of one embodiment of an OLED device with improved performance prepared with an emission-protecting layer over the LEL in accordance with the present invention. In OLED device 200, emission-protecting layer 32 is formed over LEL 26 and under electron-transporting layer 28. Emission-protecting layer 32 includes one or more materials selected to resist the surface contamination on the LEL and to reduce the loss of the electroluminescence in the OLED device. The term "surface contamination" as used in this specification means any chemical or physical adsorption of molecules, other than the molecules consisting of the bulk layer, on the surface of the examined layer. Surface contamination cannot be easily eliminated even under a vacuum system with a pressure of about $10^{-6}$ Torr. It is possible to get one monolayer of contaminants if the surface were stored in an environment with a pressure of about $10^{-6}$ Torr for 1 second providing the contaminants have a sticking coefficient of 1. The surface of the LEL is very sensitive to any contamination. Several monolayers' contaminants on that surface could result in a change in the EL performance of the OLED device. If the LEL were to be exposed to ambient conditions, a severe luminance drop could be observed. Therefore, reducing surface exposure time is a proper way to protect the LEL. From a fabrication point of view, it is inevitable that a certain time delay will occur between the formation of the LEL and the formation of the next layer on the LEL, especially in the process to fabricate full color displays. In other words, the freshly deposited LEL has to be exposed to an environment with different partial pressures of other species in the deposition chamber until the fabrication of all the color LELs is finished on the other subpixels. In some cases, the LEL, such as the radiation-transfer LEL, has to be briefly exposed to ambient conditions for the next fabrication step. Therefore, forming an emission-protecting layer 32 on LEL 26 before any further exposure is one way to protect the LEL and to improve the EL performance of the OLED device.

Emission-protecting layer 32 can comprise any one or more materials which can substantially protect the underneath LEL from surface contamination. Considering the convenience and the compatibility with the fabrication of the OLED devices, preferred materials are organic materials. Since emission-protecting layer 32 is directly in contact to LEL 26, the material used to form emission-protecting layer 32 should have an equal or greater ionization potential than that of the host material in LEL 26, and should have an equal or greater optical band gap than that of the host material in LEL 26 in order not to change the original emission color of the device. Preferably, the optical band gap of emission-protecting layer 32 is greater than 3.0 eV. Emission-protecting layer 32 should have good film formation properties to reduce the penetration of contaminants. Moreover, emission-protecting layer 32 is preferably more hydrophobic than LEL 26. In the fabrication of a full color display, a blue host material may be conveniently used to form emission-protecting layer 32. In another device fabrication, a hole-blocking layer is used in the device. In this case, the material used to form the hole-blocking layer may also be conveniently used to form emission-protecting layer 32. A thick emission-protecting layer can effectively protect the LEL. However, because the emission-protecting layer may not be necessarily functioning as the ETL, the result may be that a thick emission-protecting layer will have poor electron-transporting properties. A thin emission-protecting layer, on the other hand, may not hinder the electron-transporting properties, but the protecting function is weak. Upon considering these factors in the present invention, the emission-protecting layer 32 is selected to have a thickness of 0.1 to 50 nm, and preferably to have a thickness of 1.0 to 5.0 nm. Emission-protecting layer 32 can be formed by two or more different materials sequentially deposited or co-deposited. Desired emission-protecting materials can be deposited by any suitable means such as thermal evaporation, electron-beam evaporation, ion sputtering, or other film fabrication methods. In order to be compatible with the deposition of organic layers, emission-protecting layer 32 is preferably formed by thermal evaporation. Emission-protecting layer 32 is deposited over LEL 26. The emission-protecting layer formed over the light-emitting layer has one or more materials selected to resist the surface contamination on the organic light-emitting layer and this will ensure that there will be less surface contamination than if such layer had not been provided.

Additionally, during the fabrication of a polymeric OLED), the spin-coated or ink-jet printed LEL has to be annealed at a specific temperature over a period of time before continuing the subsequent fabrication steps. In this situation, the surface of the LEL was possibly reconstructed with the incorporation of the contaminants existing not only in the residual solvent but also in the ambient conditions. Therefore, depositing emission-protecting layer 32 on LEL 26 before annealing is one way to protect the LEL and to improve the EL performance of the polymeric OLED device.

When fabricating a polymeric OLED, the thickness of the desired emission-protecting layer can be from 0.5 to 100 nm, and can preferably be from 1.0 to 50 nm. The desired emission-protecting layer can be formed on the light-emitting layer by spin-coating, ink-jet printing, or other suitable methods before thermally annealing the LEL. The emission-protecting layer 32 in polymeric OLEDs can be one layer or multilayers as well.

Figure 3:
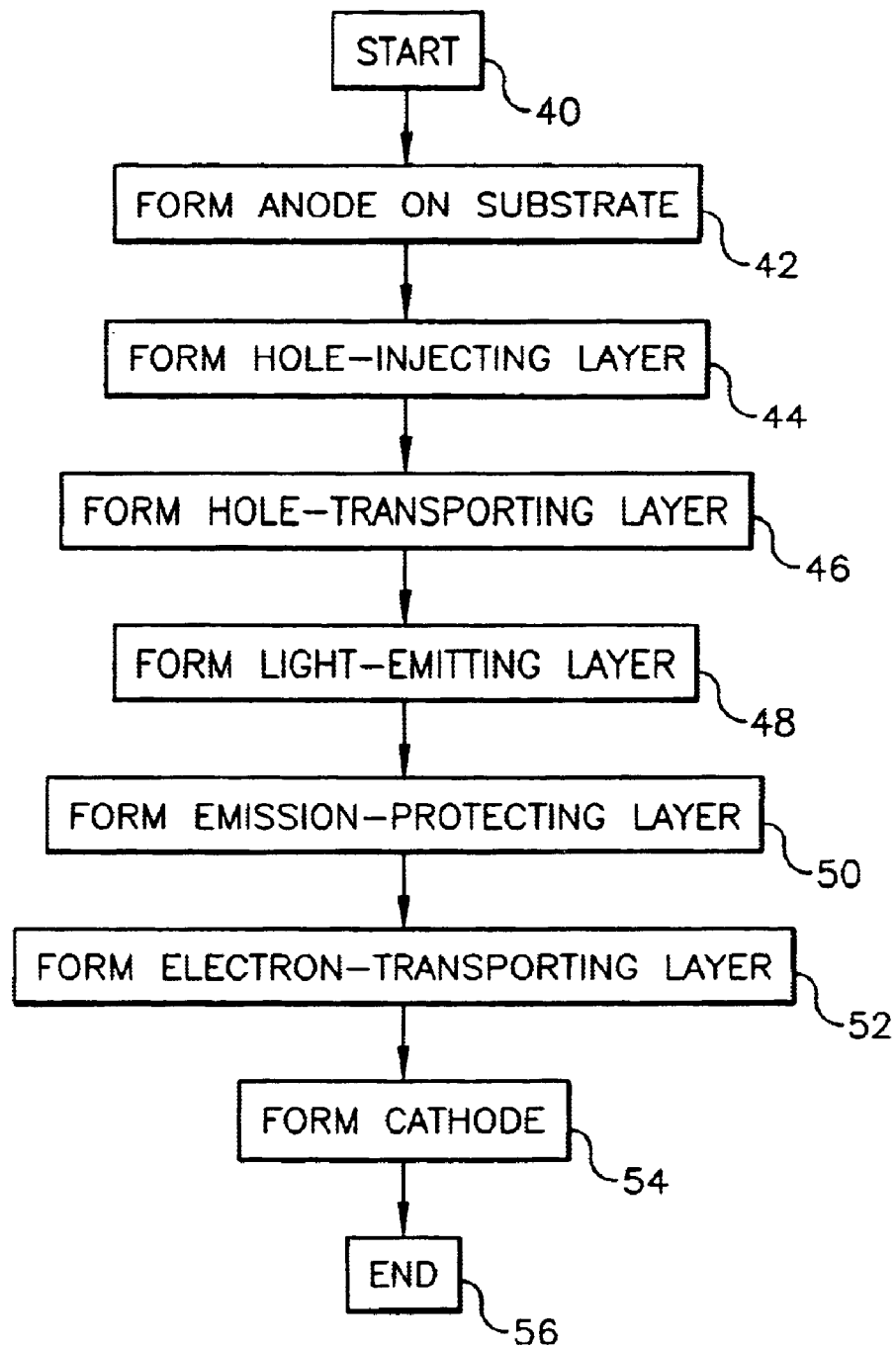
FIG. 3 is a block diagram showing the steps involved in a method according to the present invention.

Turning now to FIG. 3, and referring also to FIG. 2, there is shown a block diagram comprising the steps in one embodiment of a method for forming an organic light-emitting device according to the present invention. At the start (Step 40) of the process, anodes or patterns of anodes 20 are formed over the substrate 10 (Step 42). Alternatively, the anodes 20 can be part of the substrate 10, e.g. an OLED substrate. Then a hole-injecting layer 22 is optionally formed on the entire surface over anodes 20 (Step 44). Then a hole-transporting layer 24 is formed on the entire surface over the hole-injecting layer 22 (Step 46). Then a LEL 26 is formed over the hole-transporting layer 24 (Step 48). Then an emission-protecting layer 32 in accordance with the present invention is formed over the LEL 26 (Step 50). The emission-protecting layer 32 includes one or more materials selected to resist the surface contamination on LEL 26. An electron-transporting layer 28 is formed over the emission-protecting layer 32 (Step 52). Then a cathode layer or a series of cathodes 30 is deposited over the electron-transporting layer 28 (Step 54). There can be further steps, for example depositing a protective layer, before the end of the process (Step 56).

Figure 4:
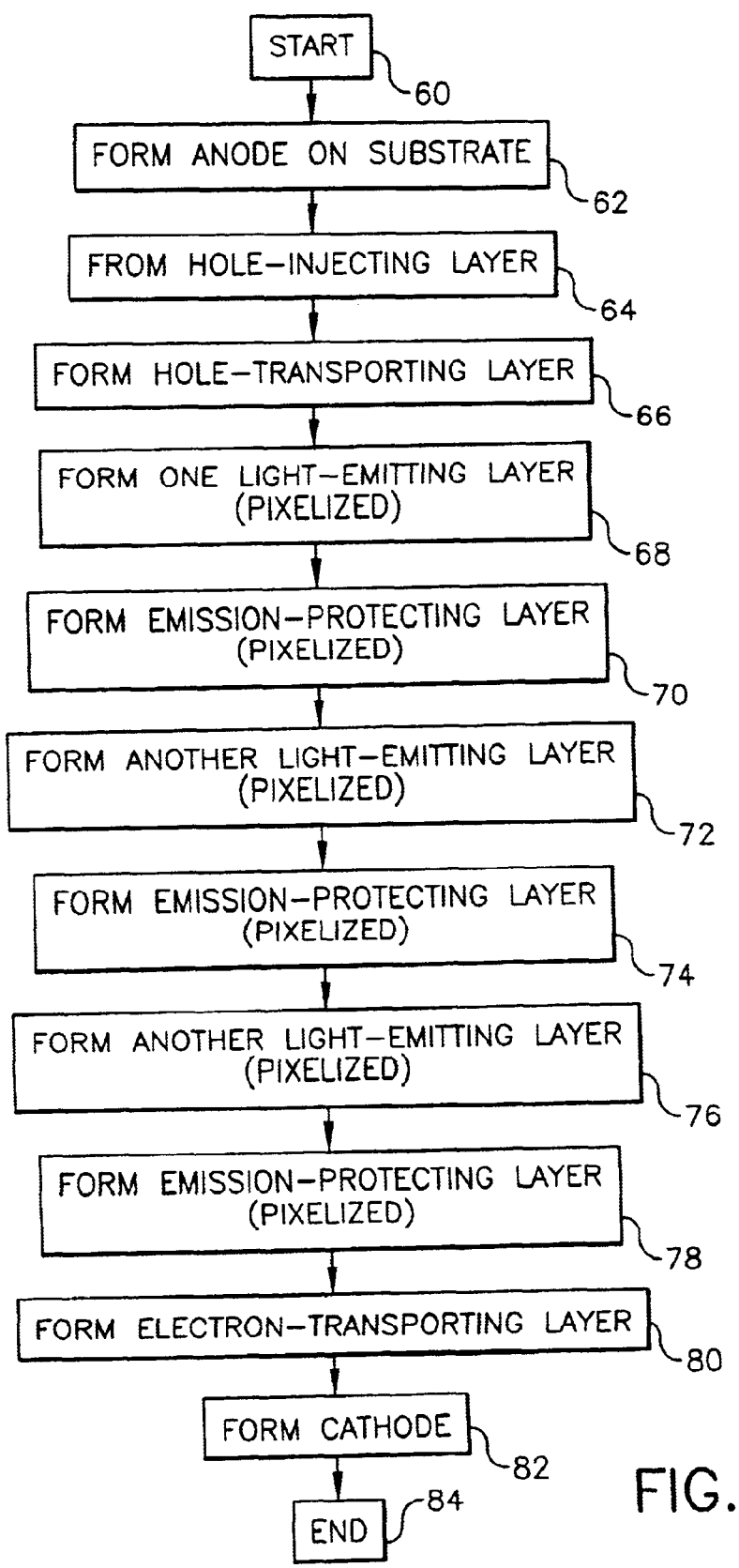
FIG. 4 is a block diagram showing the steps involved in a method according to the present invention.

Turning now to FIG. 4, and referring also to FIG. 2, there is shown a block diagram comprising the steps in another embodiment of a method for forming a full-color organic light-emitting device according to the present invention. At the start (Step 60) of the process, patterns of anodes 20 are formed over the substrate 10 (Step 62). Alternatively, anodes 20 can be part of the substrate 10, e.g. an OLED substrate. Then a hole-injecting layer 22 is optionally formed on the entire surface over anodes 20 (Step 64). Then a hole-transporting layer 24 is formed on the entire surface over the hole-injecting layer 22 (Step 66). Then one LEL 26 is formed patternwise over the hole-transporting layer 24 (Step 68) of one of the subpixels. Then an emission-protecting layer 32 in accordance with the present invention is formed over the patterned LEL 26 (Step 70). Another LEL 26 is formed patternwise over the hole-transporting layer 24 (Step 72) of another of the subpixels, and then an emission-protecting layer 32 in accordance with the present invention is formed over the patterned LEL 26 (Step 74). Yet another LEL 26 is formed patternwise over the hole-transporting layer 24 (Step 76) of another of the subpixels, and then an emission-protecting layer 32 in accordance with the present invention is formed over the patterned LEL 26 (Step 78). An electron-transporting layer 28 is formed over all of the patterned emission-protecting layers 32 (Step 80) for all the subpixels. Then a cathode layer or a series of cathodes 30 is deposited over the electron-transporting layer 28 (Step 82). There can be further steps, for example depositing a protective layer, before the end of the process (Step 84).

EXAMPLES

The present invention and its advantages can be better appreciated by the following inventive and comparative examples.

Example 1 (Inventive Example)

An OLED device with an emission-protecting layer satisfying the requirements of the invention was constructed in the following manner:

1. A clean glass substrate was vacuum-deposited with indium tin oxide (ITO) to form a transparent electrode of 34 nm thickness. The sheet resistance of the ITO layer is about 60 Ω/square.
2. The above-prepared ITO surface was treated with a plasma oxygen etch, followed by plasma deposition of a 1.0 nm layer of a fluorocarbon polymer (CFx) as described in U.S. Pat. No. 6,208,075.
3. The above-prepared substrate was further treated by vacuum-depositing under a vacuum of approximately $10^{-6}$ Torr a 75 nm HTL of 4,4'-bis[N-(1-naphthyl)-N-phenylamino]biphenyl (NPB) from a heated boat source.
4. A coating of 20 nm of tris(8-quinolinolato)aluminum (III) (Alq) as a LEL was vacuum-deposited onto the HTL at a coating station that included a heated boat source.
5. A coating of 2 nm 2-(1,1-dimethyethyl)-9,10-bis(2-naphthalenyl)anthracene (TBADN) as an emission-protecting layer was vacuum-deposited immediately following step 4 onto the LEL at a coating station that included heated boat source.
6. The above substrate was exposed to ambient conditions at 20° C. and with a relative humidity higher than 45% for 5 minutes, then returned to a vacuum.
7. A 38 nm ETL of Alq was vacuum-deposited onto the emission-protecting layer at a coating station that included a heated boat source.
8. A 210 nm cathode layer was deposited onto the ETL at a coating station with separate tantalum boats, one of which contained silver and one of which contained magnesium. The cathode layer was a 20:1 volume ratio of magnesium and silver. The OLED device was formed with a lighting area of 0.1 cm².
9. The OLED device was transferred to a dry box for encapsulation.

Example 2 (Comparative Example)

An OLED device was constructed in the manner described in Example 1, except that Step 5 (the deposition of an emission-protecting layer) was skipped, and the LEL thickness in Step 7 was changed from 38 nm to 40 nm.

Example 3 (Comparative Example)

An OLED device was constructed in the manner described in Example 1, except that Step 5 (the deposition of an emission-protecting layer) and Step 6 (exposure to ambient conditions) were skipped, and the LEL thickness in Step 7 was changed from 38 nm to 40 nm.

The devices in Examples 1–3 were tested by applying a constant current of 20 mA/cm² across the electrodes at room temperature and measuring the intensity and color. Table 1 shows the results.

TABLE 1

| Example (Type) | LEL (20 nm) | Emission-Protecting Layer (2 nm) | Ambient Exposure (>45% RH) (min) | ETL (nm) | Voltage @ 20 mA/cm² (V) | Luminance @ 20 mA/cm² (cd/m²) |
|---|---|---|---|---|---|---|
| 1 (Inventive) | Alq | TBADN | 5 | Alq (38 nm) | 7.4 | 440 |
| 2 (Comparative) | Alq | — | 5 | Alq (40 nm) | 7.5 | 219 |
| 3 (Comparative) | Alq | — | — | Alq (40 nm) | 7.3 | 516 |

It is evident that a 2 nm thick TBADN as an emission-protecting layer can effectively protect the LEL from surface contamination and reduce the loss of luminance. The device with an emission-protecting layer (Example 1) can have 2 times higher luminance as that of the device without the emission-protecting layer (Example 2) after the exposure of the LEL to ambient conditions, although the luminance of the device with the emission-protecting layer is about 85% of that of the device without the emission-protecting layer and without any exposure of its LEL to ambient conditions (Example 3).

Example 4 (Inventive Example)

An OLED device with an emission-protecting layer satisfying the requirements of the invention was constructed in the following manner:

1. A clean glass substrate was vacuum-deposited with indium tin oxide (ITO) to form a transparent electrode of 30 nm thickness. The sheet resistance of the ITO layer is about 100 Ω/square.
2. The above-prepared ITO surface was treated with a plasma oxygen etch, followed by plasma deposition of a 1.0 nm layer of a fluorocarbon polymer (CFx) as described in U.S. Pat. No. 6,208,075.
3. The above-prepared substrate was further treated by vacuum-depositing under a vacuum of approximately $10^{-6}$ Torr a 75 nm HTL of 4,4'-bis[N-(1-naphthyl)-N-phenylamino]biphenyl (NPB) from a heated boat source.

4. A coating of 20 nm of tris(8-quinolinolato)aluminum (III) (Alq) as a LEL was vacuum-deposited onto the HTL at a coating station that included a heated boat source.

5. A coating of 2 nm bis(2-methyl-8-quinolinolato)(4-phenylphenolato)aluminum (B-Alq) as an emission-protecting layer was vacuum-deposited immediately following step 4 onto the LEL at a coating station that included a heated boat source.

6. The above substrate was exposed to ambient conditions at 20° C. and, with a relative humidity about 30% for 10 minutes, then returned to a vacuum.

7. A 40 nm ETL of Alq was vacuum-deposited onto the emission-protecting layer at a coating station that included a heated boat source.

8. A 210 mm cathode layer was deposited onto the ETL at a coating station with separate tantalum boats, one of which contained silver and one of which contained magnesium. The cathode layer was a 20:1 volume ratio of magnesium and silver. The OLED device was formed with a lighting area of 0.1 cm².

9. The OLED device was transferred to a dry box for encapsulation.

Example 5 (Comparative Example)

An OLED device was constructed in the manner described in Example 4, except that Step 5 (the deposition of an emission-protecting layer) was skipped.

Example 6 (Comparative Example)

An OLED device was constructed in the manner described in Example 4, except that Step 5 (the deposition of an emission-protecting layer) and Step 6 (exposure to ambient conditions) were skipped.

The devices in Examples 4–6 were tested by applying a constant current of 20 mA/cm² across the electrodes at room temperature and measuring the intensity and color. Table 2 shows the results.

TABLE 2

| Example (Type) | LEL (20 nm) | Emission-Protecting Layer (2 nm) | Ambient Exposure (~30% RH) (min) | ETL (40 nm) | Voltage @ 20 mA/cm² (V) | Luminance @ 20 mA/cm² (cd/m²) |
|---|---|---|---|---|---|---|
| 4 (Inventive) | Alq | B-Alq | 10 | Alq | 9.3 | 490 |
| 5 (Comparative) | Alq | — | 10 | Alq | 8.9 | 341 |
| 6 (Comparative) | Alq | — | — | Alq | 10.8 | 591 |

It is evident that a 2 nm thick B-Alq as an emission-protecting layer can also effectively protect the LEL from surface contamination and reduce the loss of the luminance.

Example 7 (Inventive Example)

An OLED device was constructed in the manner described in Example 1, except that Step 6 was changed as:

6. Evaporate a 0.1 nm thick film of 4-(dicyanomethylene)-2-t-butyl-6-(1,1,7,7,-tetramethyljulolidyl-9-enyl)-4H-pyran (DCJTB) from a coating station that included a heated boat source in order to create an environment having DCJTB molecules in the vacuum with a partial pressure of about $10^{-6}$ Torr. The DCJTB molecules were prevented from directly depositing on the surface of the organic layer. This was a simulation of the fabrication process for full color displays. The evaporation process of DCJTB was finished within about 10 min.

The initial device performance was tested by applying a constant current of 20 mA/cm² across the electrodes at room temperature. The driving voltage was 8.3 V, the luminance was 628 cd/m², and the luminous efficiency was 3.1 cd/A. After the initial testing, the device was operated at 20 mA/cm² in a 70° C. oven for stability testing. There was no initial drop within the first hour of testing and the initial luminance had dropped by 20% after 190 hours of continual operation.

Example 8 (Comparative Example)

An OLED device was constructed in the manner described in Example 7, except that Step 5 (the deposition of an emission-protecting layer) was skipped, and the LEL thickness was changed from 38 mm to 40 nm in Step 7.

The initial device performance was tested by applying a constant current of 20 mA/cm² across the electrodes at room temperature. The driving voltage was 8.0 V, the luminance was 598 cd/m², and the luminous efficiency was 3.0 cd/A. After the initial testing, the device was operated at 20 mA/cm² in a 70° C. oven for stability testing. There was approximately a 5% initial drop within the first hour of testing and the initial luminance had dropped by 20% after 130 hours of continual operation.

Examples 7 and 8 show that surface contamination is still possible if the surface is sitting in the vacuum chamber waiting for the next step. This contamination may not necessarily result in poor initial performance, but may cause inferior operational stability. An emission-protecting layer can effectively protect the LEL from surface contamination and maintain good operational stability.

The invention has been described in detail with particular reference to certain preferred embodiments thereof, but it will be understood that variations and modifications can be effected within the spirit and scope of the invention.

Parts List

100 OLED device of prior art
200 OLED device of present invention
10 substrate
20 anode
22 hole-injecting layer
24 hole-transporting layer
26 light-emitting layer
28 electron-transporting layer
30 cathode
32 emission-protecting layer
40 Step
42 Step
44 Step
46 Step
48 Step 50 Step
52 Step
54 Step
56 Step
60 Step
62 Step
64 Step
66 Step
68 Step
70 Step
72 Step
74 Step
76 Step
78 Step
80 Step
82 Step
84 Step

What is claimed is:

1. An organic light-emitting device with improved performance comprising:
    a) an anode formed over a substrate;
    b) a hole-transporting layer formed over the anode;
    c) a light-emitting layer formed over the hole-transporting layer for producing light in response to hole-electron recombination;
    d) an emission-protecting layer formed over the light-emitting layer, wherein the emission-protecting layer includes one or more materials selected to resist the surface contamination on the organic light-emitting layer and to ensure that there will be less surface contamination than if such layer had not been provided;
    e) an electron-transporting layer formed over the emission-protecting layer; and
    f) a cathode formed over the electron-transporting layer.

2. The organic light-emitting device of claim 1 wherein the light-emitting layer includes at least one host and one dopant and the emission-protecting layer includes one or more materials having their ionization potentials equal to or greater than the ionization potential of the host material of the light-emitting layer.

3. The organic light-emitting device of claim 1 wherein the emission-protecting layer has an optical band gap higher than 3.0 eV.

4. The organic light-emitting device of claim 1 wherein the emission-protecting layer is more hydrophobic than the light-emitting layer.

5. The organic light-emitting device of claim 1 wherein the emission-protecting layer has a thickness in a range of from 0.1 to 10 nm.

6. The organic light-emitting device of claim 5 wherein the emission-protecting layer has a thickness in the range of from 0.5 to 5.0 nm.

7. The organic light-emitting device of claim 1 wherein the emission-protecting layer includes TBADN and B-Alq.

8. A method for preventing contamination of a light-emitting layer for use in an organic light-emitting device with improved performance comprising:
    a) forming an emission-protecting layer on the light-emitting layer, wherein the emission-protecting layer includes one or more materials selected to resist the surface contamination on the organic light-emitting layer and to ensure that there will be less surface contamination than if such layer had not been provided; and
    b) completing the organic light-emitting device.

9. The method of claim 8 wherein the emission-protecting layer is formed by evaporation.

10. The method of claim 8 wherein the emission-protecting layer can be formed by two or more different materials sequentially deposited or co-deposited.

11. The method of claim 8 wherein the emission-protecting layer has a thickness in a range of from 0.1 to 10 nm.

12. The method of claim 11 wherein the emission-protecting layer has a thickness in the range of from 0.5 to 5.0 nm.

13. The method of claim 8 wherein the emission-protecting layer includes TBADN and B-Alq.

14. A method for preventing contamination of full color-emitting pixels with improved performance comprising:
    a) forming a first color light-emitting layer on selected subpixels;
    b) forming an emission-protecting layer over the color-emitting layer on the same subpixel area with the same pixelation technique, wherein the emission-protecting layer includes one or more materials selected to resist the surface contamination on the organic light-emitting layer and to ensure that there will be less surface contamination than if such layer had not been provided; and
    c) repeating steps a) and b) for each different color emissive layer; and
    d) completing the organic light-emitting device.

15. The method of claim 14 wherein the emission-protecting layers are formed by evaporation.

16. The method of claim 14 wherein the emission-protecting layers can be formed by two or more different materials sequentially deposited or co-deposited.

17. The method of claim 14 wherein each of the emission-protecting layers has a thickness in a range of from 0.1 to 10 nm.

18. The method of claim 17 wherein each of the emission-protecting layers has a thickness in the range of from 0.5 to 5.0 nm.

19. The method of claim 14 wherein the emission-protecting layer includes TBADN and B-Alq.

20. A method for preventing contamination of a light-emitting layer for use in a polymeric organic light-emitting device with improved performance comprising:
    a) forming an emission-protecting layer on the light-emitting layer including one or more materials before thermal annealing, wherein the emission-protecting layer includes one or more materials selected to resist the surface contamination on the organic light-emitting layer and to ensure that there will be less surface contamination than if such layer had not been provided;
    b) thermally annealing the emission-protecting layer; and
    c) completing the polymeric organic light-emitting device.

21. The method of claim 20 wherein the emission-protecting layer is formed by spin-coating or by ink-jet printing.

22. The method of claim 20 wherein the emission-protecting layer has a thickness in a range of from 0.5 to 100 nm.

23. The method of claim 22 wherein the emission-protecting layer has a thickness in a range of from 1.0 to 50 nm.

* * * * *